United States Patent
Zhang et al.

(10) Patent No.: US 9,852,912 B1
(45) Date of Patent: Dec. 26, 2017

(54) METHOD OF MANUFACTURING SEMICONDUCTOR DEVICE FOR REDUCING GRAIN SIZE OF POLYSILICON

(71) Applicant: UNITED MICROELECTRONICS CORP., Hsinchu (TW)

(72) Inventors: Sheng Zhang, Singapore (SG); Liang Yi, Singapore (SG); Wen-Bo Ding, Singapore (SG); Chien-Kee Pang, Singapore (SG); Yu-Yang Chen, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/270,638

(22) Filed: Sep. 20, 2016

(51) Int. Cl.
*H01L 21/4763* (2006.01)
*H01L 21/28* (2006.01)
*H01L 27/11521* (2017.01)

(52) U.S. Cl.
CPC .. *H01L 21/28273* (2013.01); *H01L 27/11521* (2013.01)

(58) Field of Classification Search
CPC ............... H01L 21/28273; H01L 27/11521
See application file for complete search history.

(56) References Cited

U.S. PATENT DOCUMENTS

| | | | |
|---|---|---|---|
| 5,605,602 A | 2/1997 | DeBusk | |
| 6,100,150 A | 8/2000 | Shih et al. | |
| 6,967,384 B2 | 11/2005 | Beintner et al. | |
| 7,446,056 B2 | 11/2008 | Huang et al. | |
| 2002/0060320 A1* | 5/2002 | Iwamatsu | H01L 21/76264 257/51 |
| 2006/0249080 A1* | 11/2006 | Zehavi | C23C 16/4581 118/725 |
| 2012/0149170 A1* | 6/2012 | Nakazawa | H01L 21/76229 438/424 |

* cited by examiner

*Primary Examiner* — Bradley K Smith
(74) *Attorney, Agent, or Firm* — WPAT, PC

(57) ABSTRACT

A method of manufacturing a semiconductor device includes providing a silicon substrate with multiple layers formed on a front side and a backside, wherein at least a dielectric layer is formed on the backside of the silicon substrate; defining isolation regions and active regions at the front side of the silicon substrate, wherein the active regions are separated by the isolation regions; treating the multiple layers formed at the front side and the backside of the silicon substrate, so as to remain the dielectric layer as an outermost layer exposed at the backside of the silicon substrate; and depositing a polysilicon layer on the isolation regions and the active regions at the front side of the silicon substrate.

17 Claims, 7 Drawing Sheets

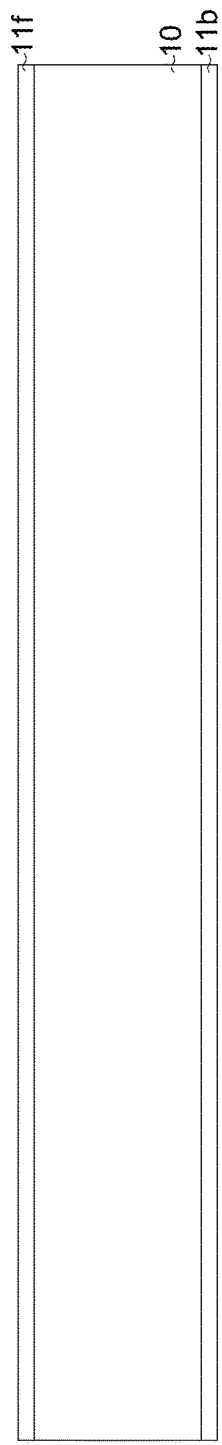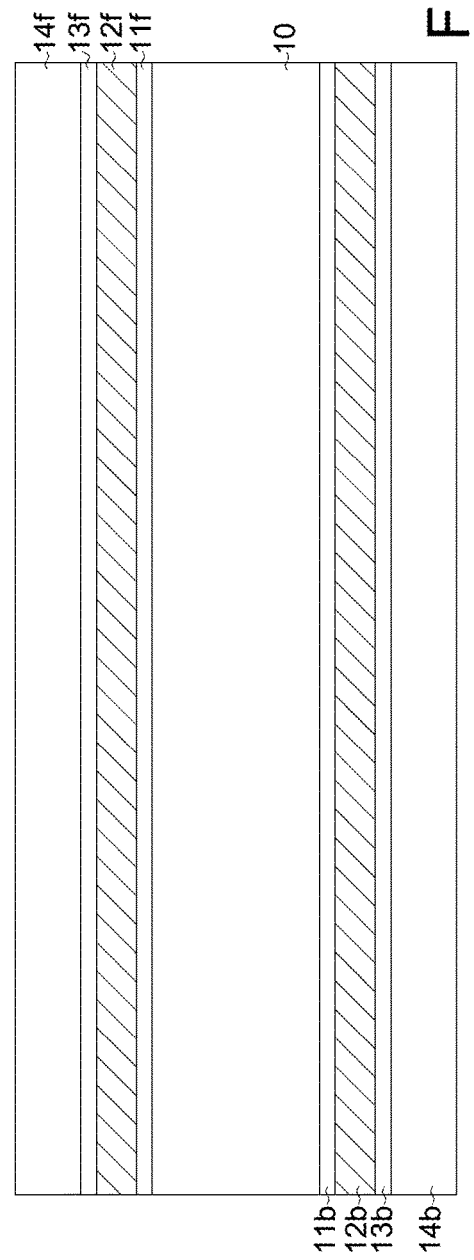

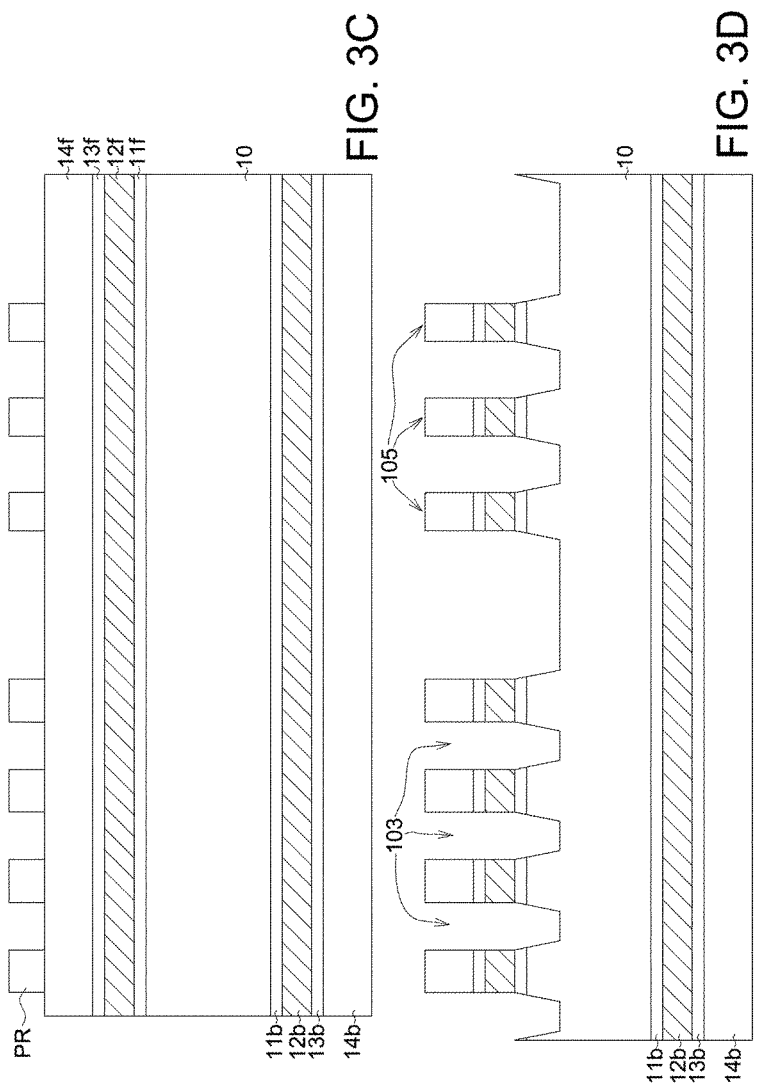

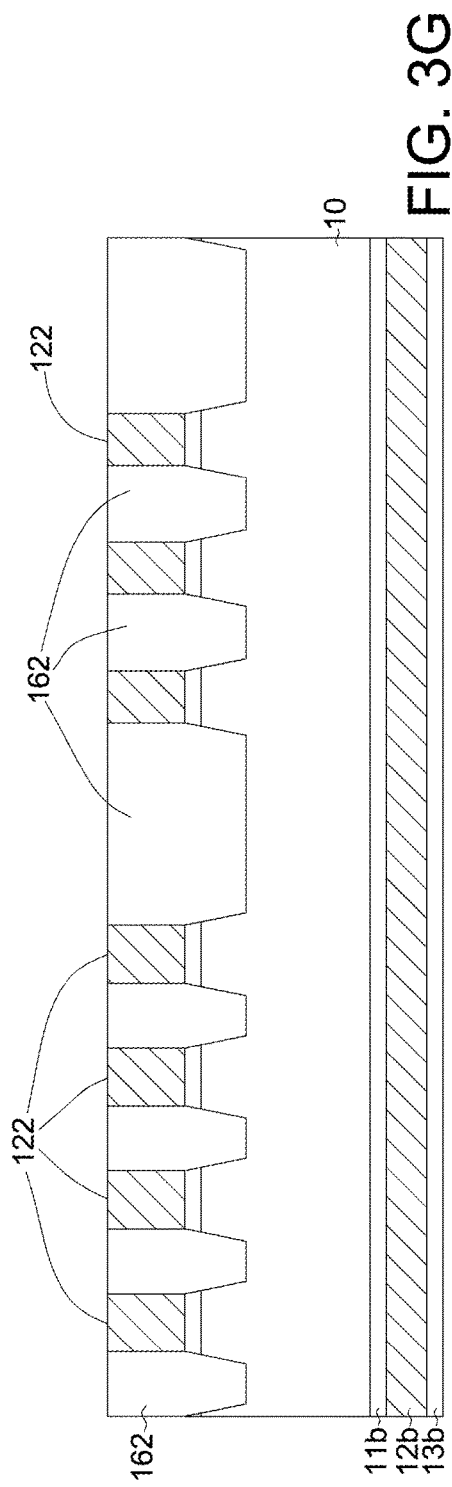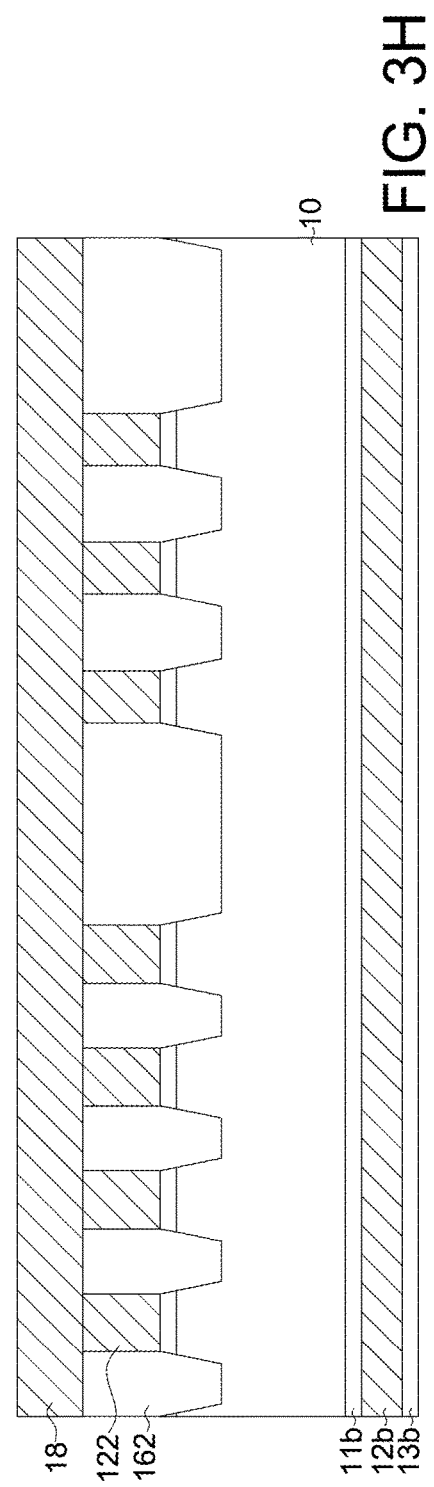

METHOD OF MANUFACTURING SEMICONDUCTOR DEVICE FOR REDUCING GRAIN SIZE OF POLYSILICON

BACKGROUND

Technical Field

The disclosure relates in general to a method of manufacturing a semiconductor device, and more particularly to a method of manufacturing a semiconductor device for reducing grain size of polysilicon.

Description of the Related Art

Reduction of feature size, improvements of the rate, the efficiency, the density and the cost per integrated circuit unit are the important goals in the semiconductor technology. The electrical properties of the device have to be maintained even improved (ex: with the decrease of the size) to meet the requirements of the commercial products in applications. Also, the layers and components with defects would have considerable effects on the electrical performance of the device. For example, the conventional method for manufacturing the semiconductor device comprises many thermal processes, which induces growth of grain size of polysilicon. Since large grain size polysilicon induces implant penetration through channel to the silicon substrate, a silicon substrate with a polysilicon having large grain size formed thereon could cause considerable deterioration on the electrical properties of the devices.

SUMMARY

The disclosure is directed to a method of manufacturing a semiconductor device. The proposed method of the present embodiment provides a way for effectively reducing grain size of polysilicon, thereby improving the properties of the semiconductor device.

According to one aspect of the present disclosure, a method of manufacturing a semiconductor device is provided, including providing a silicon substrate with multiple layers formed on a front side and a backside, wherein at least a dielectric layer is formed on the backside of the silicon substrate; defining isolation regions and active regions at the front side of the silicon substrate, wherein the active regions are separated by the isolation regions; treating the multiple layers formed at the front side and the backside of the silicon substrate, so as to remain the dielectric layer as an outermost layer exposed at the backside of the silicon substrate; and depositing a polysilicon layer on the isolation regions and the active regions at the front side of the silicon substrate.

According to another aspect of the present disclosure, a method of manufacturing a semiconductor device is provided, including providing a silicon substrate having a front side and a backside, and isolation portions and polysilicon portions being formed and exposed at the front side of the silicon substrate, and at least a dielectric layer remained as an outermost layer exposed at the backside of the silicon substrate, wherein the polysilicon portions are separated by the isolation portions; depositing a polysilicon layer on the isolation portions and the polysilicon portions at the front side of the silicon substrate when the dielectric layer is exposed at the backside of the silicon substrate.

BRIEF DESCRIPTION OF THE DRAWINGS

FIG. 3A-FIG. 3H illustrate a method of manufacturing a semiconductor device according to one embodiment of the disclosure.

Figure 1:
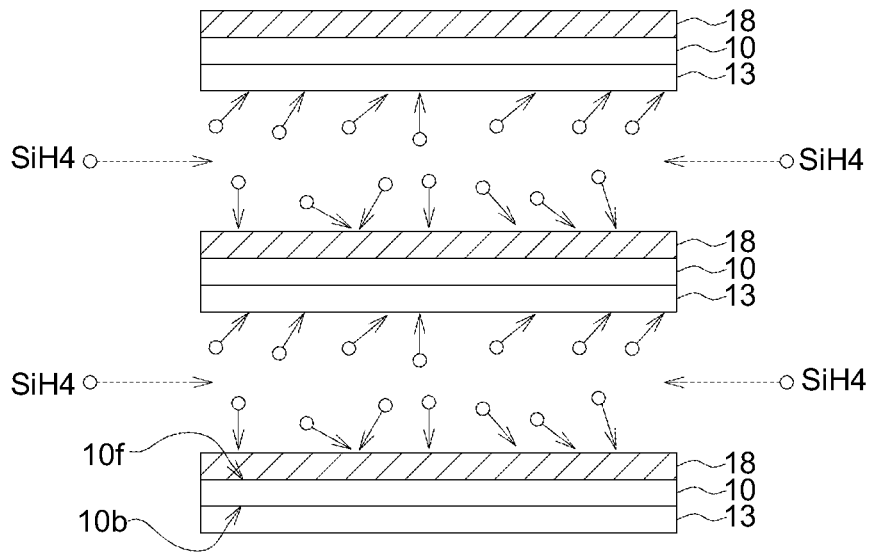
FIG. 1 is a simple illustration showing manufacture of the semiconductor devices according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a method of manufacturing a semiconductor device for reducing grain size of polysilicon is provided. According to the method of the embodiment, the grain size of polysilicon can be reduced, and the conventional problem of implant dopant penetration into the substrate through channel can be effectively solved. Also, no thermal budge change in the embodied method. Therefore, the electrical properties of the semiconductor device manufactured by applying the embodied method can be significantly improved.

The embodiment of the present invention (i.e. the substrate with a backside dielectric film during polysilicon deposition) can be applied to manufacture a semiconductor device with different types of flash memory cells. Embodiments are provided hereinafter with reference to the accompanying drawings for describing the related procedures and configurations. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1 is a simple illustration showing manufacture of the semiconductor devices according to the present disclosure. In the typical manufacturing method, several silicon substrates are placed in a furnace with a silane or disilane ambient, and arranged by facing the polysilicon layers (ex: the polysilicon layer as an outermost layer exposed at the backside of the silicon substrate) to each other of adjacent silicon substrates. However, polysilicon consumes lots of silane (or disilane) and has short incubation time, thereby growing polysilicon with large grain size. According to the embodied method, as shown in FIG. 1, a dielectric layer 13 as an outermost layer exposed at the backside 10b of the silicon substrate 10 is provided before deposition of a polysilicon layer (ex: known as "Poly2") 18 on the isolation regions (ex: STI) and the active regions (ex: known as "Poly1") at the front side 10f of the silicon substrate 10.

During the manufacturing method, silane (or disilane) flows from wafer edge to wafer center, and dielectric material has longer incubation time than polysilicon. In one embodiment, the dielectric layer 13 comprises oxides, nitrides or a combination thereof. Examples of the dielectric layer 13 include a silicon oxide ($SiO_2$) layer, a silicon nitride (SiN) layer and a silicon oxynitride (SiON) layer.

Figure 2:
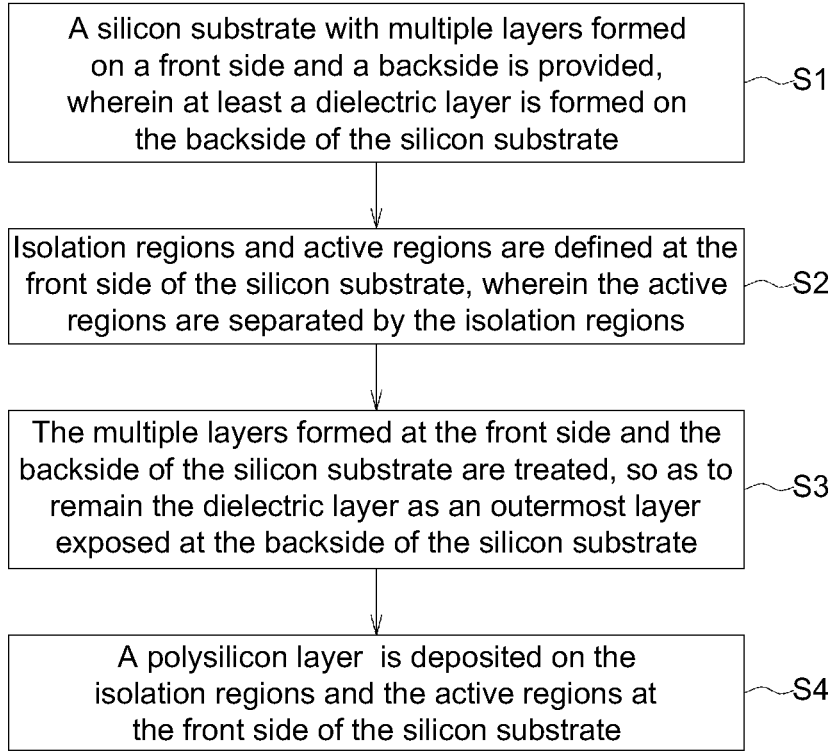
FIG. 2 is a flow diagram of a method of manufacturing a semiconductor device according to the embodiment of the disclosure.

According to the embodied method, the isolation regions and conductive regions have been defined at the front side 10f of the silicon substrate 10 before the deposition of the polysilicon layer 18, and the dielectric layer 13 formed as an outermost layer is exposed at the backside 10b of the silicon substrate 10 during the polysilicon growing. FIG. 2 is a flow diagram of a method of manufacturing a semiconductor device according to the embodiment of the disclosure. First, a silicon substrate with multiple layers formed on a front side and a backside is provided, wherein at least a dielectric layer is formed on the backside of the silicon substrate (step S1). Then, isolation regions (ex: comprising STI oxides) and active regions (ex: comprising polysilicon portions) are defined at the front side of the silicon substrate, wherein the active regions are separated by the isolation regions (step S2). The multiple layers formed at the front side and the backside of the silicon substrate are treated (ex: removing both pad nitride layers and the front pad oxide layer), so as to remain the dielectric layer (ex: 13 in FIG. 1) as an outermost layer exposed at the backside of the silicon substrate (step S3). Afterward, a polysilicon layer (ex: Poly2) is deposited on the isolation regions and the active regions at the front side of the silicon substrate (step S4).

Figure 3E:
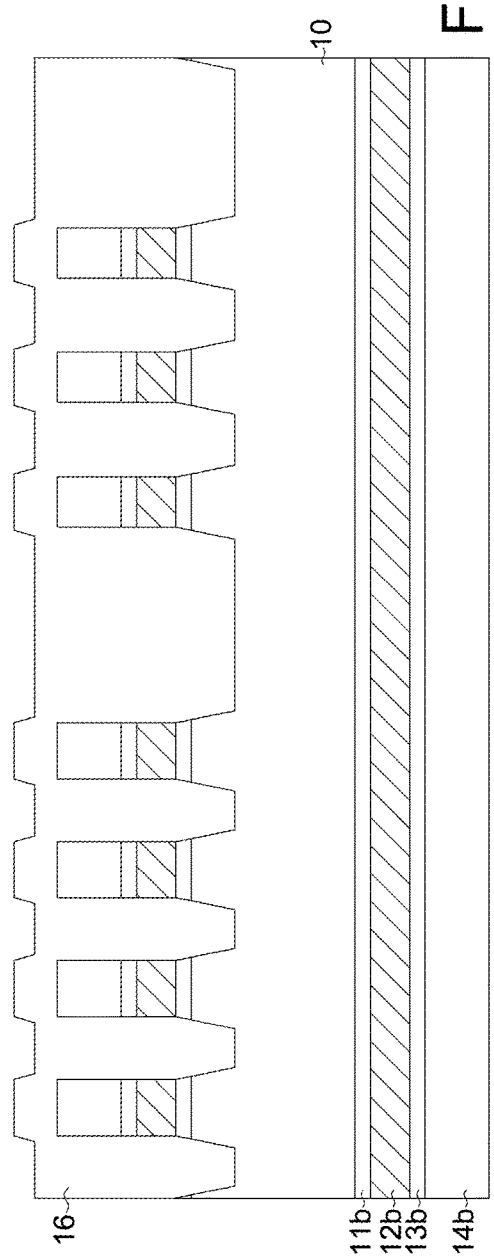

FIG. 3A-FIG. 3H illustrate a method of manufacturing a semiconductor device according to one embodiment of the disclosure. It is noted that the drawings and illustrations are provided for describing the disclosure, and the present disclosure is not limited to the details shown in the drawings. First, a silicon substrate 10 with multiple layers formed on a front side 10b and a backside 10f is provided. As shown in FIG. 3A, a silicon substrate 10 with the gate oxide layers 11b and 11f respectively formed on the front side 10b and the backside 10f of the silicon substrate 10 is provided.

Then, other related layers are formed on the silicon substrate 10, wherein the material of the related layer can be deposited or grown on the front and back sides of the silicon substrate simultaneously. For example, a first conductive layer 12f (ex: comprising polysilicon, and can be referred as "Poly1"), a first pad oxide layer 13f and a first pad nitride layer 14f are formed on the front side 10f of the silicon substrate 10, wherein the first pad nitride layer 14f is formed on the first pad oxide layer 13f and the first conductive layer 12f is formed on the gate oxide layer 11f, as shown in FIG. 3B. Also, a second conductive layer 12b, a second pad oxide layer 13b and a second pad nitride layer 14b are formed on the backside 10b of the silicon substrate 10, wherein the second pad nitride layer 14b is formed on the second pad oxide 13b layer and the second conductive layer 12b is formed on the gate oxide layer 11b, as shown in FIG. 3B. In one example, the first pad oxide layer 13f and the second pad oxide layer 13b may be made of silicon oxide. In one example, the first pad nitride layer 14f and the second pad nitride layer 14b can be made of silicon nitride. Noted that those numerical values of related layers are provided only for illustration, not for limitation.

Next, a photo-resist layer PR is formed on the first pad nitride layer 14f, as shown in FIG. 3C, for defining isolation regions and active regions at the front side of the silicon substrate 10 in the subsequent steps.

Afterwards, as shown in FIG. 3D, the first pad nitride layer 14f, the first pad oxide layer 13f, the first conductive layer 12f, the gate oxide layer 11f and the silicon substrate 10 are patterned according to the photo-resist layer PR so as to form the trenches 103 and the patterned stacks 105, thereby respectively defining the isolation regions (corresponding to the trenches 103) and the active regions (corresponding to the patterned stacks 105) at the front side of the silicon substrate 10.

Afterwards, an insulation layer 16 is formed on the trenches 103 and the patterned stacks 105, wherein the insulation layer 16 fills up the trenches 103 and covers the patterned stacks 105, as shown in FIG. 3E. Optionally, steps of trench liner pre-clean and trench liner oxidation can be performed before formation of the insulation layer 16. In one embodiment, the insulation layer 16 can be a high-density plasma (HDP) chemical vapor deposition (CVD) oxide.

Figure 3F:
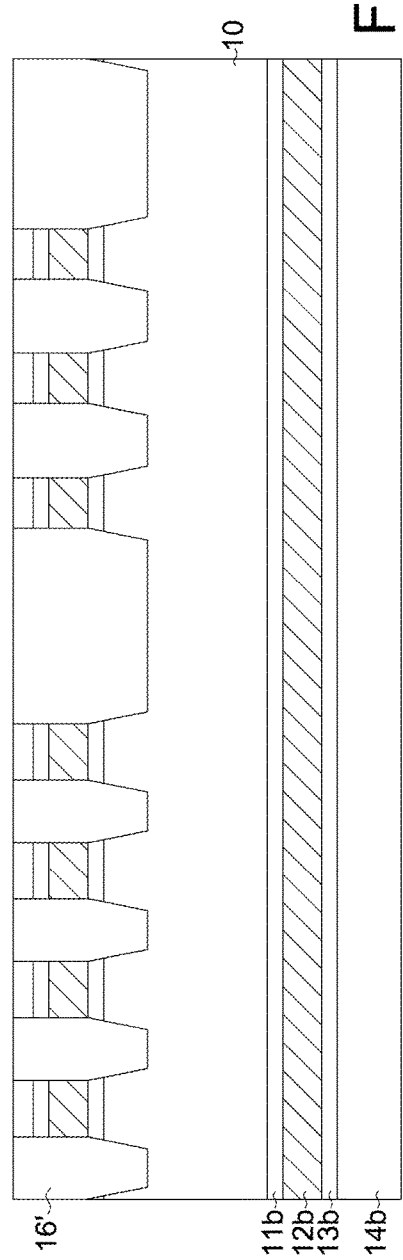

Then, a planarization step is conducted, as shown in FIG. 3F. In one embodiment, the insulation layer 16 is chemical-mechanical polished and stop on the first pad nitride layer 14f to form an insulation layer 16'.

Afterwards, removal of the nitride layers at the backside 10b and front side 10f of the silicon substrate 10, followed by removing the oxide layer at the front side 10f of the silicon substrate 10 are conducted. In the embodiment, the first pad nitride layer 14f and the second pad nitride layer 14b are removed (ex: by hot $H_3PO_4$), and then the first pad oxide layer 13f is removed (such as by single wafer clean; ex: dry oxide etching), so that the second pad oxide layer 13b (i.e. the dielectric layer) is remained as the outermost layer exposed at the backside 10b of the silicon substrate 10, as shown in FIG. 3G. In FIG. 3G, after removal steps, several isolation portions 162 (ex: STI) and polysilicon portions 122 are formed and exposed at the front side 10f of the silicon substrate 10, wherein the isolation portions 162 and the polysilicon portions 122 are separated from each other.

Next, in the presence of the second pad oxide layer 13b (i.e. the dielectric layer) as the outermost layer exposed at the backside 10b of the silicon substrate 10, deposition of a polysilicon layer 18 (can be referred as "Poly2") is conducted. As shown in FIG. 3H, the polysilicon layer 18 is deposited on the isolation portions 162 and the polysilicon portions 122 at the front side of the silicon substrate 10 when a dielectric layer (ex: the second pad oxide layer 13b) is exposed at the backside of the silicon substrate 10. In one embodiment, the polysilicon layer 18 is deposited in a furnace at 600° C.-660° C., with a thickness of about 1200 Å.

In this exemplified process, after forming the polysilicon layer 18, the polysilicon layer 18 directly contacts the polysilicon portions 122. The embodiment of the present invention can be applied to manufacture a semiconductor device with flash memory cells. In one application, the floating gate of the flash memory cell comprises the polysilicon portions 122 and configuration patterned from the polysilicon layer 18.

<Experimental Results>

Figure 4:
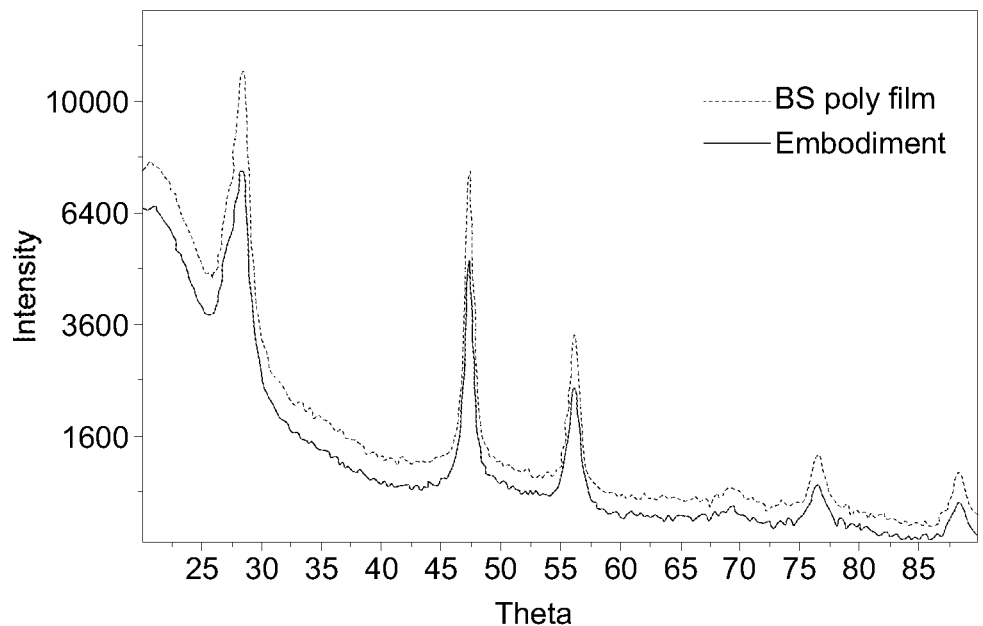
FIG. 4 shows effects on grain size of polysilicon grown in different configurations of the semiconductor devices.
Figure 5:
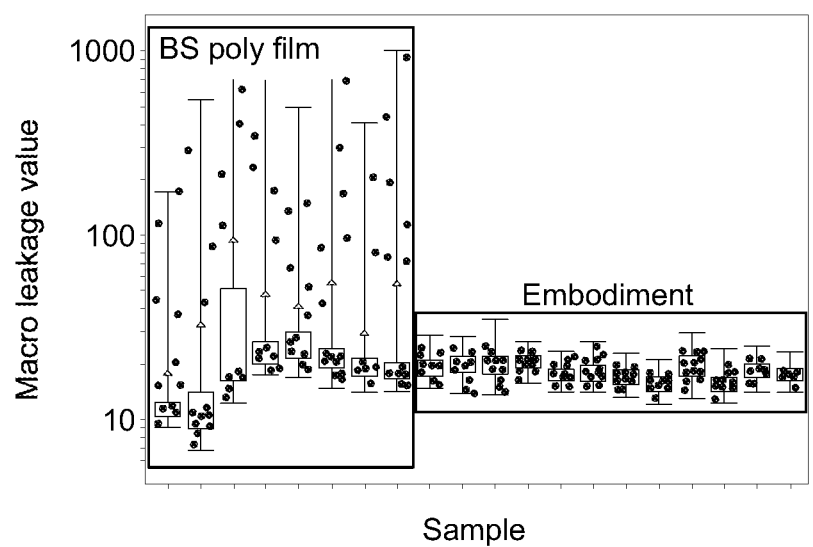
FIG. 5 shows the macro leakage of the semiconductor devices with conventional and embodied configurations.
Figure 6:
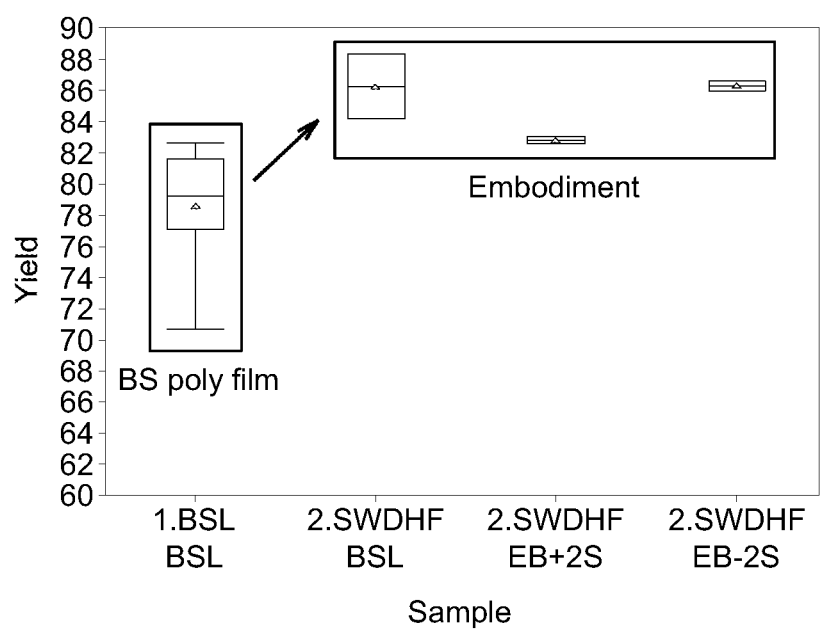
FIG. 6 shows the yields of the semiconductor devices with conventional and embodied configurations.

Some of experiments are conducted for investigating the effects of the method of the embodiment. In FIG. 4-FIG. 6, the curve or the region labeled as "BS poly film" represents the result of conventional device with a polysilicon layer as the outmost layer on the backside of the silicon substrate, and the curve or the region labeled as "Embodiment" represents the result of embodied device with a dielectric layer as the outmost layer on the backside of the silicon substrate.

FIG. 4 shows effects on grain size of polysilicon grown in different configurations of the semiconductor devices. Compared to the results of the conventional method (ex: Poly1 on the backside) and the embodied method (dielectric film (ex: 13b) on the backside), the grain size formed by the embodied method does reduced from about 129 Å to 123 Å. Also, the wafers are monitored to investigate the extinction coefficient (k), and k of the wafer formed by the embodied method does increase, which means the grain size is reduced.

FIG. 5 shows the macro leakage of the semiconductor devices with conventional and embodied configurations. Compared to the results of the conventional method (ex: Poly1 on the backside) and the embodied method (dielectric film on the backside), the macro leakage of the structure manufactured by the embodied method has been eliminated (with much better distribution) since the polysilicon grain size is reduced.

Also, FIG. 6 shows the yields of the semiconductor devices with conventional and embodied configurations. According to the results, the yield of the embodied semiconductor device does improve 6% to 15%.

According to the aforementioned descriptions, a dielectric layer is formed in the embodied method as an outermost layer exposed at the backside of the silicon substrate during deposition of polysilicon (ex: the polysilicon layer 18). According to the method of the embodiment, the grain size of polysilicon (ex: the polysilicon layer 18) does reduced, thereby effectively solving the conventional problem of implant dopant penetration into the substrate through channel. Also, no thermal budge change in the embodied method. Accordingly, the semiconductor device manufactured by applying the embodied method has significantly improved properties such as elimination of macro leakage of the cells, yield of production and electrical performance.

Other embodiments with different configurations of known elements in the semiconductor devices or flash memory cells can be applicable, and the arrangement of layers and components depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure. Moreover, although a dielectric material having longer incubation time than polysilicon is provided in the embodiment as described above for reducing grain size of polysilicon, other material having shorter incubation time than polysilicon (i.e. consumes less silane than polysilicon) can be applied as an outermost layer exposed at the backside 10b of the silicon substrate 10 for growing polysilicon with large grain size in other practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a semiconductor device, comprising:
   providing a silicon substrate with multiple layers formed on a front side and a backside, wherein at least a dielectric layer is formed on the backside of the silicon substrate;
   defining isolation regions and active regions at the front side of the silicon substrate, wherein the active regions are separated by the isolation regions;
   treating the multiple layers formed at the front side and the backside of the silicon substrate, so as to remain the dielectric layer as an outermost layer exposed at the backside of the silicon substrate; and
   depositing a polysilicon layer on the isolation regions and the active regions at the front side of the silicon substrate in the presence of the dielectric layer as the outermost layer exposed at the backside of the silicon substrate.

2. The method according to claim 1, wherein the dielectric layer comprises oxides, nitrides or a combination thereof.

3. The method according to claim 1, wherein the dielectric layer is a silicon oxide ($SiO_2$) layer, a silicon nitride (SiN) layer or a silicon oxynitride (SiON) layer.

4. The method according to claim 1, wherein the isolation regions comprises isolation portions, and the active regions comprises polysilicon portions.

5. The method according to claim 4, wherein before forming the polysilicon layer, the polysilicon portions and the dielectric layer are exposed at the front side and the backside of the silicon substrate, respectively.

6. The method according to claim 4, wherein the polysilicon layer directly contacts the polysilicon portions at the front side after forming the polysilicon layer.

7. The method according to claim 1, wherein the polysilicon layer is deposited in a furnace with a silane or disilane ambient.

8. The method according to claim 7, further comprising:
   providing a plurality of the silicon substrates in the furnace, wherein the active regions and the dielectric layer of each of the plurality of the silicon substrates are respectively exposed at the front side and the backside of the silicon substrate;
   arranging the plurality of the silicon substrates by facing the dielectric layer to the active regions of adjacent silicon substrates; and
   depositing the polysilicon layer on the isolation regions and the active regions at the front side of each of the plurality of the silicon substrates.

9. The method according to claim 1, wherein the multiple layers comprises:
   a first pad oxide layer and a first pad nitride layer formed on the front side of the silicon substrate, wherein the first pad nitride layer is formed on the first pad oxide layer; and
   a second pad oxide layer and a second pad nitride layer formed on the backside of the silicon substrate, wherein the second pad nitride layer is formed on the second pad oxide layer.

10. The method according to claim 9, wherein steps of defining the isolation regions and the active regions comprises:

patterning the first pad nitride layer, the first pad oxide layer, a gate oxide layer and the silicon substrate to form trenches and patterned stacks; and forming an insulation layer on the trenches and the patterned stacks, followed by planarization.

11. The method according to claim 10, wherein steps of treating the multiple layers comprise:

removing the first pad nitride layer and the second pad nitride layer; and removing the first pad oxide layer (by single wafer clean), and remaining the dielectric layer as the outermost layer exposed at the backside of the silicon substrate.

12. A method for manufacturing a semiconductor device, comprising:

providing a silicon substrate having a front side and a backside, and isolation portions and polysilicon portions being formed and exposed at the front side of the silicon substrate, and at least a dielectric layer remained as an outermost layer exposed at the backside of the silicon substrate, wherein the polysilicon portions are separated by the isolation portions; and depositing a polysilicon layer on the isolation portions and the polysilicon portions at the front side of the silicon substrate when the dielectric layer is exposed at the backside of the silicon substrate.

13. The method according to claim 12, wherein the dielectric layer comprises oxides, nitrides or a combination thereof, and the polysilicon layer is deposited in a furnace.

14. The method according to claim 12, wherein the dielectric layer comprises oxides, nitrides or a combination thereof.

15. The method according to claim 12, wherein the isolation portions comprises oxides.

16. The method according to claim 12, wherein the polysilicon layer directly contacts the polysilicon portions after forming the conductive layer.

17. The method according to claim 12, further comprising:

providing a plurality of the silicon substrates in the furnace, wherein the polysilicon portions and the dielectric layer of each of the plurality of the silicon substrates are respectively exposed at the front side and the backside of the silicon substrate;

arranging the plurality of the silicon substrates by facing the dielectric layer to the polysilicon portions of adjacent silicon substrates; and depositing the polysilicon layer on the isolation regions and the polysilicon portions at the front side of each of the plurality of the silicon substrates.

* * * * *